US009799633B2

(12) United States Patent
Markytan et al.

(10) Patent No.: US 9,799,633 B2
(45) Date of Patent: Oct. 24, 2017

(54) SEMICONDUCTOR LIGHT SOURCE WITH A FIRST AND A SECOND LED CHIP AND A FIRST AND A SECOND FLUORESCENT SUBSTANCE

(71) Applicant: OSRAM OPTO SEMICONDUCTORS GMBH, Regensburg (DE)

(72) Inventors: Ales Markytan, Regensburg (DE); Christian Gärtner, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 5 days.

(21) Appl. No.: 14/408,240

(22) PCT Filed: Jun. 6, 2013

(86) PCT No.: PCT/EP2013/061716
§ 371 (c)(1),
(2) Date: Dec. 15, 2014

(87) PCT Pub. No.: WO2013/186119
PCT Pub. Date: Dec. 19, 2013

(65) Prior Publication Data
US 2015/0137155 A1 May 21, 2015

(30) Foreign Application Priority Data
Jun. 15, 2012 (DE) .......... 10 2012 105 208

(51) Int. Cl.
*H01L 25/075* (2006.01)
*H01L 33/56* (2010.01)
*H01L 33/50* (2010.01)

(52) U.S. Cl.
CPC ........ *H01L 25/0753* (2013.01); *H01L 33/504* (2013.01); *H01L 33/507* (2013.01); *H01L 33/56* (2013.01); *H01L 2924/0002* (2013.01)

(58) Field of Classification Search
USPC .......................................... 257/89
See application file for complete search history.

(56) References Cited

U.S. PATENT DOCUMENTS

| 8,172,632 B2 | 5/2012 | Lin et al. |
| 2008/0142816 A1* | 6/2008 | Bierhuizen ............... F21K 9/00 257/82 |

(Continued)

FOREIGN PATENT DOCUMENTS

| DE | 10 2005 020 695 | 12/2005 |
| DE | 10 2010 046 790 | 3/2012 |

(Continued)

*Primary Examiner* — Marcos D Pizarro
*Assistant Examiner* — Lawrence Tynes, Jr.
(74) *Attorney, Agent, or Firm* — Cozen O'Connor

(57) ABSTRACT

A semiconductor light source comprising first and second light-emitting diode chips; and a conversion element containing a first phosphor and a second phosphor, wherein the conversion element is disposed downstream of the first and second light-emitting diode chips. The first light-emitting diode chip emits electromagnetic radiation with a first emission maximum. The second light-emitting diode chip emits electromagnetic radiation with a second emission maximum. The first phosphor has a first absorption maximum and a first radiating maximum. The second phosphor has a second absorption maximum, which differs from the first absorption maximum, and a second radiating maximum, which differs from the first radiating maximum. The degree of conversion of the first phosphor for the electromagnetic radiation of the first light-emitting diode chip is greater than the degree of conversion of the second phosphor (Continued)

for the electromagnetic radiation of the first light-emitting diode chip.

14 Claims, 2 Drawing Sheets

(56) References Cited

U.S. PATENT DOCUMENTS

| | | |
|---|---|---|
| 2010/0118510 A1 | 5/2010 | Bailey et al. |
| 2011/0037415 A1 | 2/2011 | Juestel et al. |
| 2011/0043101 A1* | 2/2011 | Masuda .............. C09K 11/0883 |
| | | 313/503 |
| 2011/0221330 A1 | 9/2011 | Negley et al. |
| 2012/0286701 A1* | 11/2012 | Yang .................. C09K 11/7731 |
| | | 315/312 |

FOREIGN PATENT DOCUMENTS

| | | |
|---|---|---|
| EP | 1 160 883 | 5/2001 |
| JP | 2002 057376 | 2/2002 |
| WO | WO 2008/072196 | 6/2008 |
| WO | WO 2010/023840 | 3/2010 |
| WO | WO 2011/002686 | 1/2011 |

* cited by examiner

SEMICONDUCTOR LIGHT SOURCE WITH A FIRST AND A SECOND LED CHIP AND A FIRST AND A SECOND FLUORESCENT SUBSTANCE

RELATED APPLICATIONS

This is a U.S. National Phase Application under 35 USC 371 of International Application PCT/EP2013/061716 filed on Jun. 6, 2013.

This application claims the priority of German application no. 10 2012 105 208.5 filed Jun. 15, 2012, the entire content of which is hereby incorporated by reference.

FIELD OF THE INVENTION

The invention is related to a semiconductor light source.

One object to be achieved is to specify a semiconductor light source which can be produced particularly cost-effectively.

This and other objects are attained in accordance with one aspect of the invention directed to a semiconductor light source comprising: a first light-emitting diode chip and a second light-emitting diode chip, which each emit electromagnetic radiation during operation; and at least one conversion element containing a first phosphor and a second phosphor. The conversion element is disposed downstream of the first light-emitting diode chip and the second light-emitting diode chip. The first light-emitting diode chip emits electromagnetic radiation with a first emission maximum during operation. The second light-emitting diode chip emits electromagnetic radiation with a second emission maximum, which differs from the first emission maximum, during operation. The first phosphor has a first absorption maximum and a first radiating maximum. The second phosphor has a second absorption maximum, which differs from the first absorption maximum, and a second radiating maximum, which differs from the first radiating maximum. The degree of conversion of the first phosphor for the electromagnetic radiation of the first light-emitting diode chip is greater than the degree of conversion of the second phosphor for the electromagnetic radiation of the first light-emitting diode chip.

In accordance with at least one embodiment of the semiconductor light source, the semiconductor light source comprises a first light-emitting diode chip and a second light-emitting diode chip, which each emit electromagnetic radiation during operation. In this case, the light-emitting diode chips are suitable, in particular, for emitting electromagnetic radiation from the spectral range from UV radiation to blue light.

In particular, it is possible for the first light-emitting diode chip and the second light-emitting diode chip to be formed in the same semiconductor system. By way of example, the first light-emitting diode chip and the second light-emitting diode chip are based on a nitride compound semiconductor material such as InGaN, for example. The two light-emitting diode chips can then be operated with the same drive circuit, for example.

In the present context, based on nitride compound semiconductor material means that a semiconductor layer sequence of the light-emitting diode chip or at least one part thereof, particularly preferably at least one active zone and/or a growth substrate, comprises or consists of a nitride compound semiconductor material, preferably $Al_nGa_m In_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise for example one or more dopants and additional constituents. For the sake of simplicity, however, the above formula includes only the essential constituents of the crystal lattice (Al, Ga, In, N), even if these can be replaced and/or supplemented in part by small amounts of further substances.

The first and second light-emitting diode chips are preferably embodied differently relative to one another. By way of example, the first light-emitting diode chip emits electromagnetic radiation with a first emission maximum during operation, and the second light-emitting diode chip emits electromagnetic radiation with a second emission maximum, wherein the first emission maximum differs from the second emission maximum. That is to say that the maximum spectral emission of the first light-emitting diode chip differs from the maximum spectral emission of the second light-emitting diode chip. Preferably, the first and second light-emitting diode chips in this case emit light of the same color, in particular blue light, wherein the wavelengths of the emission maxima and thus also the dominant wavelengths of the two light-emitting diode chips differ from one another, however.

When it is stated here and hereinafter that maxima are different, then that means that absolute or relative maxima lie at different wavelengths.

The first and second light-emitting diode chips and, if applicable, further light-emitting diode chips of the semiconductor light source can preferably be operated separately from one another. That is to say that the light-emitting diode chips can emit electromagnetic radiation at identical and at different times.

In accordance with at least one embodiment of the semiconductor light source, the semiconductor light source comprises at least one conversion element containing a first phosphor and a second phosphor. By way of example, the conversion element comprises a matrix material, such as silicone, into which particles of a first phosphor and of a second phosphor are introduced. Furthermore, it is possible for the conversion element to be a ceramic conversion element in which the first and second phosphors are sintered jointly.

In this case, the conversion element is disposed downstream of the first light-emitting diode chip and the second light-emitting diode chip. That is to say that preferably a large part of the electromagnetic radiation which is emitted by the two light-emitting diode chips enters the conversion element and is absorbed there at least partly by the first phosphor and/or by the second phosphor. The phosphors thereupon radiate electromagnetic radiation in particular having a longer wavelength. In other words, the first light-emitting diode chip and the second light-emitting diode chip are designed for generating primary radiation that is at least partly converted by the phosphors of the conversion element to form secondary radiation. The conversion element can then radiate mixed light, for example which is composed of the primary radiation and the secondary radiation.

The first phosphor has a first absorption maximum and a first radiating maximum. The second phosphor has a second absorption maximum and a second radiating maximum. The absorption maxima of the first phosphor and second phosphor are preferably different, and the radiating maxima of the first phosphor and second phosphor are preferably likewise different. That is to say that each of the two phosphors has a specific wavelength range, the absorption maximum, in which the absorption of electromagnetic radiation generated by one of the light-emitting diode chips, for example, is particularly high. Furthermore, each of the two phosphors has a radiating maximum corresponding to the maximum spectral emission of the phosphor on account of the excitation with electromagnetic radiation in the absorption maximum. The radiating maxima of the two phosphors can in this case lie in the region of the same color, but are preferably different from one another.

In accordance with at least one embodiment of the semiconductor light source, the degree of conversion of the first phosphor for the electromagnetic radiation of the first light-emitting diode chip is greater than the degree of conversion of the second phosphor for the electromagnetic radiation of the first light-emitting diode chip.

In this case, the degree of conversion of a phosphor is, for example, the ratio of the energy of the primary radiation which is absorbed by the phosphor to the total energy of the primary radiation. That is to say that a degree of conversion of 50% is attained if the phosphor absorbs half of the energy of the primary radiation. At least part of the absorbed energy is radiated by the phosphor in the form of secondary radiation.

In the present case, the degree of conversion of the first phosphor for the electromagnetic radiation of the first light-emitting diode chip is greater than the degree of conversion of the second phosphor for the electromagnetic radiation of the first light-emitting diode chip.

That is to say that the first phosphor and the first light-emitting diode chip are matched to one another. This can be achieved, for example, by virtue of the fact that the emission maximum of the first light-emitting diode chip lies in the region of the first absorption maximum. That is to say that the wavelengths of the first emission maximum and of the first absorption maximum are identical, for example. In this case, it is possible, in particular, that the first light-emitting diode chip does not excite or only hardly excites the second phosphor. In this way, principally mixed radiation is radiated by the conversion element during operation of only the first light-emitting diode chip, said mixed radiation being composed of the primary radiation of the first light-emitting diode chip and the secondary radiation of the first phosphor.

In accordance with at least one embodiment of the semiconductor light source, the semiconductor light source comprises a first light-emitting diode chip and a second light-emitting diode chip, which each emit electromagnetic radiation during operation. Furthermore, the semiconductor light source comprises at least one conversion element containing a first phosphor and a second phosphor, wherein the conversion element is disposed downstream of the first light-emitting diode chip and the second light-emitting diode chip. In this case, the first light-emitting diode chip is designed for emitting electromagnetic radiation with a first emission maximum during operation, and the second light-emitting diode chip is designed for emitting electromagnetic radiation with a second emission maximum, wherein the two emission maxima differ from one another. The first phosphor of the conversion element has a first absorption maximum and a first radiating maximum, the second phosphor has a second absorption maximum and a second radiating maximum; the absorption maxima and the radiating maxima of the two phosphors differ here in each case. The degree of conversion of the first phosphor for the electromagnetic radiation of the first light-emitting diode chip is furthermore greater than a degree of conversion of the second phosphor for the electromagnetic radiation of the first light-emitting diode chip.

In the case of the semiconductor light source described here, it is possible, in particular, for a single conversion element having two different phosphors to be disposed downstream of two different light-emitting diode chips. Such a semiconductor light source can be produced more simply and more cost-effectively than a semiconductor light source in which a dedicated conversion element is disposed downstream of each light-emitting diode chip, which dedicated conversion element contains, for example, in each case only one phosphor coordinated with the respective light-emitting diode chip. Furthermore, the light-emitting diode chips of the semiconductor light source can be arranged particularly near to one another, which, for example, allows the use of a common optical element and reduces the angle dependence of a color homogeneity.

In accordance with at least one embodiment of the semiconductor light source, the degree of conversion of the second phosphor for the electromagnetic radiation of the second light-emitting diode chip is greater than the degree of conversion of the second phosphor for the electromagnetic radiation of the first light-emitting diode chip. That is to say that the second phosphor and the second light-emitting diode chip are matched to one another, for example by virtue of the fact that the second emission maximum lies in the region of the second absorption maximum.

If, in the case of the semiconductor light source, the first light-emitting diode chip is operated, for example, then it excites principally the first phosphor and mixed light of a first type is generated. If, in the case of the semiconductor light source, the second light-emitting diode chip is operated, then it excites principally the second phosphor and mixed light of a second type is generated. By alternately or simultaneously operating the first and second light-emitting diode chips, it is possible to generate mixed light, for example white mixed light, in a relatively large color locus range in a simple manner.

In accordance with at least one embodiment of the semiconductor light source, the first emission maximum lies in the region of the first absorption maximum, and the second emission maximum lies in the region of the second absorption maximum. In this case, "lies in the region" means, for example, that the wavelengths of the emission maxima and absorption maxima assigned to one another differ from one another by at most +/−5 nm, preferably by at most +/−2 nm. This ensures that principally the first phosphor is pumped by the first light-emitting diode chip during operation and principally the second phosphor is pumped by the second light-emitting diode chip during operation.

In accordance with at least one embodiment of the semiconductor light source described here, the following relationship holds true for the degrees of conversion of the phosphors: the degree of conversion of the first phosphor for the electromagnetic radiation of the first light-emitting diode chip divided by the degree of conversion of the second phosphor for the electromagnetic radiation of the first light-emitting diode chip is greater than the degree of conversion of the first phosphor for the electromagnetic radiation of the second light-emitting diode chip divided by the degree of conversion of the second phosphor for the electromagnetic radiation of the second light-emitting diode chip.

The two phosphors of the conversion element are selected in this way such that the degree of conversion of at least one of the phosphors changes with the change in the wavelength of the primary radiation of the light-emitting diode chips such that the first phosphor, compared with the second phosphor, absorbs to a greater extent at the first emission maximum than at the second emission maximum.

In this way, it is possible, for example, for the two light-emitting diode chips to be potted jointly with a common conversion element, without an impermissibly high proportion of light being absorbed by the second phosphor during the operation of, for example, the first light-emitting diode chip. That is to say that despite the two light-emitting diode chips being arranged spatially particularly near to one another, the two phosphors of the conversion element can be excited separately from one another.

In accordance with at least one embodiment, in this case the first absorption maximum differs from the second absorption maximum by at least 2 nm. This makes it possible to ensure that the two phosphors can be excited separately, even if they are present in the same conversion element.

In accordance with at least one embodiment of the semiconductor light source, the first radiating maximum differs from the second radiating maximum by at least 5 nm. Furthermore, the first radiating maximum differs from the second radiating maximum in particular by at most 50 nm. This makes it possible to ensure that a particularly large color space can be spanned with the two phosphors and, if applicable, the primary radiation of the two light-emitting diode chips.

In accordance with at least one embodiment of the semiconductor light source, the first emission maximum differs from the second emission maximum by at least 2 nm. Furthermore, the first emission maximum differs from the second emission maximum in particular by at most 20 nm, preferably by at most 10 nm. This makes it possible to ensure that, first, a relatively large color locus range can be spanned; secondly, targeted pumping of the two phosphors by different light-emitting diode chips is possible.

In accordance with at least one embodiment of the semiconductor light source, the first light-emitting diode chip and the second light-emitting diode chip emit light in the blue spectral range. That is to say that the two light-emitting diode chips generate electromagnetic radiation in the range of blue light during operation, wherein the emission maxima thereof preferably differ from one another by at least 2 nm.

In accordance with at least one embodiment of the semiconductor light source, the first phosphor and the second phosphor radiate light in the green spectral range. That is to say that the two phosphors that are excited by the light of the light-emitting diode chips generate green secondary radiation, the radiating maxima of which differ from one another by at least 5 nm. In this case, the light of the two phosphors mixes with the light of the assigned light-emitting diode chips. That is to say that, by way of example, blue-greenish-white (also called "mint") mixed light can be generated by the first light-emitting diode chip and by the first phosphor during the operation of the semiconductor light source. The mixed light of the second light-emitting diode chip and of the second phosphor is then yellow-greenish-white light, for example.

In accordance with at least one embodiment of the semiconductor light source, the semiconductor light source comprises a third light-emitting diode chip, which emits electromagnetic radiation with a third emission maximum, which differs from the first emission maximum and from the second emission maximum, during operation. In particular, the third light-emitting diode chip is a light-emitting diode chip which is formed in a different semiconductor system than the first two light-emitting diode chips. By way of example the third light-emitting diode chip can be formed with a phosphide-based compound semiconductor material. The third light-emitting diode chip can then be provided in particular for emitting light in the red spectral range.

For this purpose, by way of example, the third light-emitting diode chip can be based on a phosphide compound semiconductor material such as InGaAlP, for instance.

In this context, "based on phosphide compound semiconductor material" means that the semiconductor layer sequence of the third light-emitting diode chip or at least one part thereof, particularly preferably at least the active zone and/or the growth substrate, preferably comprises $Al_nGa_mIn_{1-n-m}P$ or $As_nGa_mIn_{1-n-m}P$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents. For the sake of simplicity, however, the above formula includes only the essential constituents of the crystal lattice (Al or As, Ga, In, P), even if these can be replaced in part by small amounts of further substances.

In accordance with at least one embodiment of the semiconductor light source, the conversion element is disposed downstream of the third light-emitting diode chip, and the electromagnetic radiation of the third light-emitting diode chip is not absorbed or is hardly absorbed in the conversion element. That is to say that the light of the third light-emitting diode chip can preferably penetrate through the conversion element in a relatively undisturbed manner. By way of example, at most 10% of the energy of the light of the third light-emitting diode chip is absorbed in the conversion element.

In this case, the light of the third light-emitting diode chip preferably excites no emission of secondary radiation in the conversion element. The third light-emitting diode chip makes it possible to span a particularly large color space for example in simultaneous operation with one of the other two light-emitting diode chips or with both light-emitting diode chips.

Particularly with the use of one third light-emitting diode chip that emits red light and two first and second light-emitting diode chips that emit blue light, it is possible to generate white light along the Planckian locus in a large color temperature range. In this regard, with the semiconductor light source described here, white light in a color temperature range of at least 2500 K to at most 6500 K can be generated in a simple manner by the corresponding driving of the light-emitting diode chips.

In accordance with at least one embodiment of a semiconductor light source described here, the following values hold true for the light-emitting diode chips and the phosphors of the semiconductor light source: the first emission maximum lies approximately at 440 nm, the second emission maximum lies approximately at 450 nm, the third emission maximum lies between at least 600 nm and at most 660 nm, the first absorption maximum lies approximately at 440 nm, the second absorption maximum lies approximately at 450 nm, the first radiating maximum lies approximately at 520 nm, and the second radiating maximum lies approximately at 565 nm. The value indications include, in particular, tolerances of $\pm 5\%$, preferably of $\pm 1\%$. With correspondingly selected phosphors and light-emitting diode chips it is possible to generate white light in a particularly large color locus range by the corresponding driving of the three light-emitting diode chips. By way of example, in this case the phosphor L173 is employed as the first phosphor, and the phosphor $GYAG_{Prem}$ is employed as the second phosphor.

In accordance with at least one embodiment of the semiconductor light source, the semiconductor light source comprises at least two first light-emitting diode chips, at least two second light-emitting diode chips and at least two third light-emitting diode chips. That is to say that the size of the semiconductor light source is scalable by increasing the number of respective light-emitting diode chips.

Furthermore, it is possible for fourth, fifth, sixth or further light-emitting diode chips to be present in the semiconductor light source, to which light-emitting diode chips further phosphors can also be assigned. In this case, for example, further light-emitting diodes are used but the light of which is not absorbed by the phosphors of the conversion element. Furthermore, it is possible for further light-emitting diode chips to be used, to which further phosphors are assigned, to which their emission is matched.

In accordance with at least one embodiment of the semiconductor light source, all of the light-emitting diode chips are encapsulated with a common potting compound which forms the conversion element. By way of example, the potting compound comprises as matrix material a silicone into which the phosphors are introduced as particles. The conversion element formed in this way can cover the light-emitting diode chips, that is to say for example the first light-emitting diode chip, the second light-emitting diode chip and the third light-emitting diode chip, at the exposed outer areas. The semiconductor light source described here therefore makes it possible to provide light-emitting diode chips of different types jointly with a volume potting, wherein the color locus of the mixed light generated by the semiconductor light source can be set particularly simply. This results in a cost saving and improved color mixing in comparison with semiconductor light sources in which each light-emitting diode chip is assigned a dedicated conversion element, for example as a lamina on the outer area of the chip.

The light-emitting diode chips of the semiconductor light source can be arranged relatively near to one another on account of the common potting, thus resulting in a particularly homogeneous color of the generated mixed light and a particularly homogeneously emitting luminous area of the semiconductor light source. For the phosphors, use is made of, in particular, green phosphors with a radiating maximum of between at least 520 nm and at most 580 nm, which are transparent in particular for third light-emitting diode chips which emit red light and which can emit electromagnetic radiation in a wavelength range of between at least 600 nm and at most 680 nm. In this way, these third light-emitting diode chips can also be arranged within the potting compound.

Alternatively, it is possible for the conversion element to be embodied as a plate, for example, which is disposed downstream of all the light-emitting diode chips at a distance therefrom. Advantageously, during the operation of the light-emitting diode chips, such a conversion element is heated to a lesser extent than a conversion element embodied as a potting compound. In this way, the color of the generated mixed light is dependent on the operating temperature of the semiconductor light source to a lesser extent.

Furthermore, optical elements such as coupling-out lenses, scattering elements or further conversion elements can be disposed downstream in the conversion element in a semiconductor light source described here. In this case, it is also possible that, for example, light-scattering particles are introduced into the potting compound that forms the conversion element. Furthermore, by way of example, an outer area of the conversion element embodied as a potting compound can be structured in a lens-shaped fashion.

A semiconductor light source described here is explained in greater detail below on the basis of exemplary embodiments and the associated figures.

DETAILED DESCRIPTION OF THE DRAWINGS

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
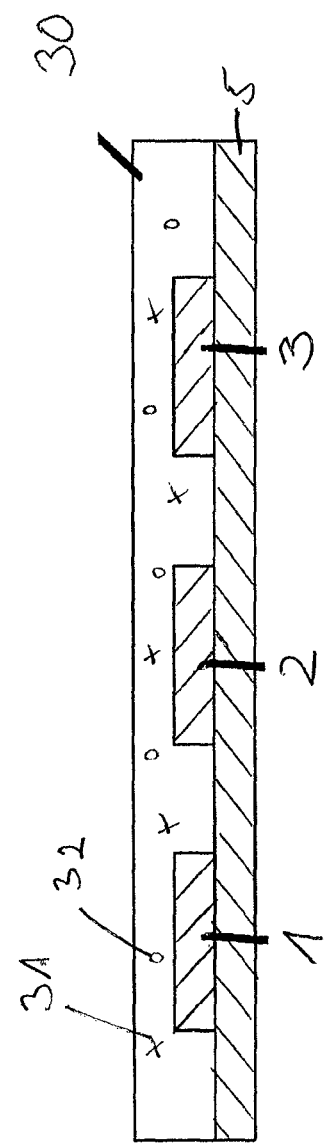
FIG. 1 shows a semiconductor light source described here in a schematic sectional illustration.

FIG. 1 shows a schematic sectional illustration of a semiconductor light source described here. In the exemplary embodiment in FIG. 1, the semiconductor light source comprises a carrier 5. The carrier 5 is embodied as a connection carrier or printed circuit board, for example. That is to say that the carrier 5 comprises conductor tracks and/or electrical connection locations to which the light-emitting diode chips 1, 2, 3 are electrically conductively connected.

In this case, the semiconductor light source comprises a first light-emitting diode chip 1, which generates blue light with a first emission maximum B1 at 440 nm. In this case, the first light-emitting diode chip 1 is based on InGaN, for example.

The semiconductor light source furthermore comprises a second light-emitting diode chip 2, which emits blue light at a second emission maximum B2 of 450 nm. The second light-emitting diode chip 2 can also be based on InGaN.

The semiconductor light source furthermore comprises a third light-emitting diode chip 3, which emits light with a third emission maximum, in the present case at 615 nm.

A potting material is disposed downstream of all of the light-emitting diode chips 1, 2, 3 at their outer area not covered by the carrier 5, said potting material in the present case comprising a silicone matrix material into which first phosphors 31 and second phosphors 32 are introduced.

The first phosphor 31 is the phosphor L173, for example. The first phosphor 31 has a first absorption maximum K1 at 440 nm and a first radiating maximum A1 at 520 nm.

The second phosphor 32 is, for example, the phosphor $GYAG_{Prem}$ with a second absorption maximum K2 at 450 nm and a second radiating maximum A2 at 565 nm.

During the operation of the semiconductor light source, it is possible, for example, for only the first light-emitting diode chip 1 to be operated. In this case, the first phosphor 31 is excited and mixed radiation in the color locus range 15a (see FIG. 2) is generated.

If only the second light-emitting diode chip 2 is operated, then the second phosphor 32 is excited and mixed light in the color locus range 15b is generated.

If only the first light-emitting diode chip and the second light-emitting diode chip are operated, then light in the color locus range 10a can be generated depending on operating current or operating duration with the aid of a pulse width modulation circuit.

Figure 2:
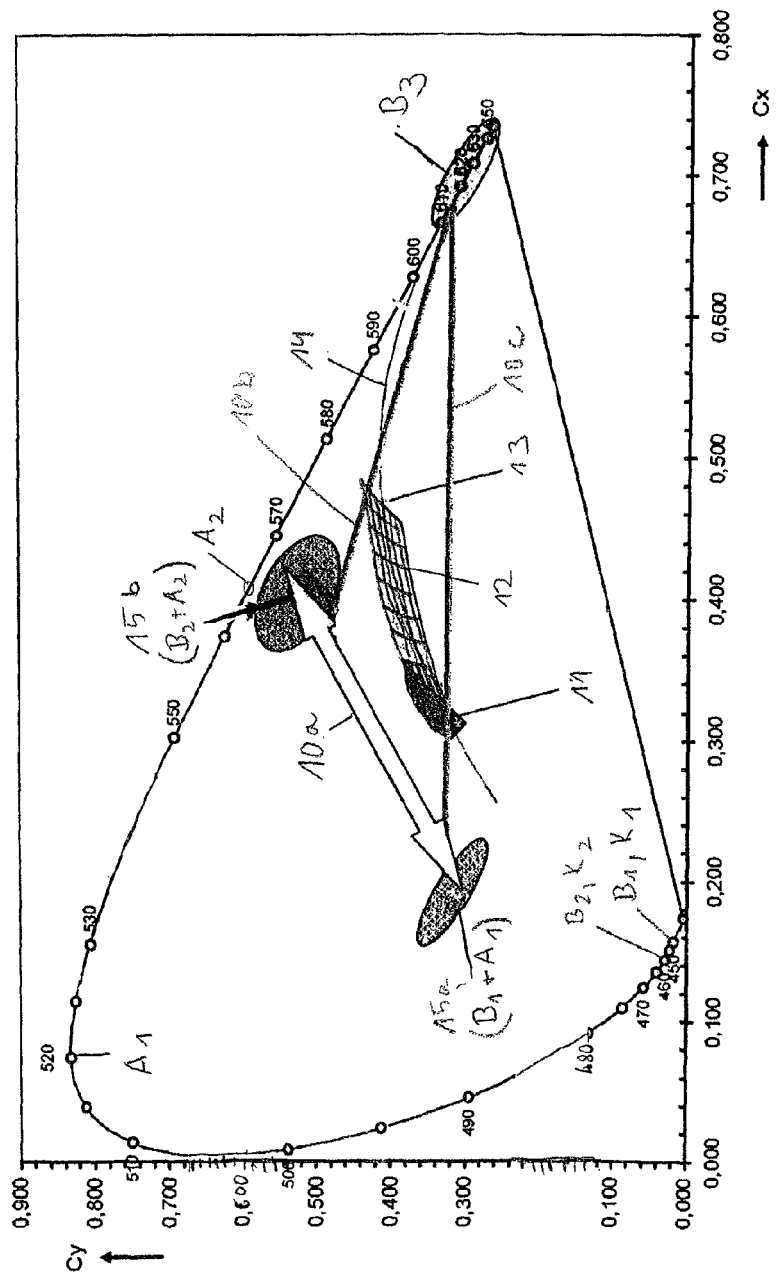
With reference to FIG. 2, an explanation is given of the functioning of a semiconductor light source described here.

If the third light-emitting diode chip 3 is switched on, which in the present case generates red light, then it is possible to generate mixed light in a region of the CIE diagram which is bounded by the color locus ranges 10a, 10b and 10c in FIG. 2. In this case, 10b represents the color loci which are accessible if only the second light-emitting diode chip and the third light-emitting diode chip are operated. The color locus range 10c corresponds to the color loci which are accessible if the first light-emitting diode chip and the third light-emitting diode chip are operated.

In order to generate white mixed light along the Planckian locus 14, it is possible to generate color temperatures from a color locus 11 having a color temperature of 2500 K up to a color locus 13 having a color temperature of 6500 K.

In the case of the semiconductor light source described here, it is thus possible, for example by choosing the current intensity with which the individual light-emitting diode chips are operated, in a particularly simple manner, to set the color temperature and the color of the generated mixed light in a particularly large range.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. A semiconductor light source comprising:
a first light-emitting diode chip and a second light-emitting diode chip, which each emit electromagnetic radiation during operation; and
at least one conversion element containing a first phosphor and a second phosphor,
wherein the conversion element is disposed downstream of the first light-emitting diode chip and the second light-emitting diode chip,
wherein the first light-emitting diode chip emits electromagnetic radiation with a first emission maximum during operation,
wherein the second light-emitting diode chip emits electromagnetic radiation with a second emission maximum, which differs from the first emission maximum, during operation,
wherein the first phosphor has a first absorption maximum and a first radiating maximum,
wherein the second phosphor has a second absorption maximum, which differs from the first absorption maximum, and a second radiating maximum, which differs from the first radiating maximum,
wherein a degree of conversion of the first phosphor for the electromagnetic radiation of the first light-emitting diode chip is greater than a degree of conversion of the second phosphor for the electromagnetic radiation of the first light-emitting diode chip,
wherein the emission maximum of the first light-emitting diode chip lies in a region of the first absorption maximum,
wherein the first absorption maximum and the second absorption maximum differ from one another by at least 2 nm and at most 10 nm, and
wherein the second emission maximum lies in a region of the second absorption maximum.
2. A semiconductor light source comprising:
a first light-emitting diode chip and a second light-emitting diode chip, which each emit electromagnetic radiation during operation; and
at least one conversion element containing a first phosphor and a second phosphor,
wherein the conversion element is disposed downstream of the first light-emitting diode chip and the second light-emitting diode chip,
wherein the first light-emitting diode chip emits electromagnetic radiation with a first emission maximum during operation,
wherein the second light-emitting diode chip emits electromagnetic radiation with a second emission maximum, which differs from the first emission maximum, during operation,
wherein the first phosphor has a first absorption maximum and a first radiating maximum,
wherein the second phosphor has a second absorption maximum, which differs from the first absorption maximum, and a second radiating maximum, which differs from the first radiating maximum,
wherein a degree of conversion of the first phosphor for the electromagnetic radiation of the first light-emitting diode chip is greater than a degree of conversion of the second phosphor for the electromagnetic radiation of the first light-emitting diode chip,
wherein the first phosphor and the second phosphor radiate light in a green spectral range,
wherein the first radiating maximum and the second radiating maximum differ from one another by at least 5 nm, and
wherein the emission maximum of the first light-emitting diode chip lies in a region of the first absorption maximum, and the emission maximum of the second light-emitting diode chip lies in a region of the second absorption maximum.
3. The semiconductor light source according to claim 2, wherein the degree of conversion of the second phosphor for the electromagnetic radiation of the second light-emitting diode chip is greater than the degree of conversion of the first phosphor for the electromagnetic radiation of the second light-emitting diode chip.
4. The semiconductor light source according to claim 2, wherein the following relationship holds true:
the degree of conversion of the first phosphor for the electromagnetic radiation of the first light-emitting diode chip divided by the degree of conversion of the second phosphor for the electromagnetic radiation of the first light-emitting diode chip is greater than the degree of conversion of the first phosphor for the electromagnetic radiation of the second light-emitting diode chip divided by the degree of conversion of the second phosphor for the electromagnetic radiation of the second light-emitting diode chip.
5. The semiconductor light source according to claim 2, wherein the first absorption maximum and the second absorption maximum differ from one another by at least 2 nm.
6. The semiconductor light source according to claim 2, wherein the first emission maximum and the second emission maximum differ from one another by at least 2 nm.
7. The semiconductor light source according to claim 2, wherein the first light-emitting diode chip and the second light-emitting diode chip emit light in a blue spectral range.
8. The semiconductor light source according to claim 2, comprising:
a third light-emitting diode chip, which emits electromagnetic radiation with a third emission maximum, which differs from the first emission maximum and from the second emission maximum, during operation.
9. The semiconductor light source according to claim 8, wherein the conversion element is disposed downstream of the third light-emitting diode chip, and the electromagnetic radiation of the third light-emitting diode chip is not absorbed or is hardly absorbed in the conversion element.

10. The semiconductor light source according to claim 8, wherein the third light-emitting diode chip emits light in the red spectral range.

11. The semiconductor light source according to claim 8, wherein:
the first emission maximum lies approximately at 440 nm,
the second emission maximum lies approximately at 450 nm,
the third emission maximum lies in between at least 600 nm and at most 660 nm,
the first absorption maximum lies approximately at 440 nm,
the second absorption maximum lies approximately at 450 nm,
the first radiating maximum lies approximately at 520 nm, and
the second radiating maximum lies approximately at 565 nm.

12. The semiconductor light source according to claim 8, comprising at least two first light-emitting diode chips, at least two second light-emitting diode chips and at least two third light-emitting diode chips.

13. The semiconductor light source according to claim 2, wherein all of the light-emitting diode chips are encapsulated with a common potting compound which forms the conversion element.

14. A semiconductor light source comprising:
a first light-emitting diode chip and a second light-emitting diode chip, which each emit electromagnetic radiation during operation; and
at least one conversion element containing a first phosphor and a second phosphor,
wherein the conversion element is disposed downstream of the first light-emitting diode chip and the second light-emitting diode chip,
wherein the first light-emitting diode chip emits electromagnetic radiation with a first emission maximum during operation,
wherein the second light-emitting diode chip emits electromagnetic radiation with a second emission maximum, which differs from the first emission maximum, during operation,
where the first phosphor has a first absorption maximum and a first radiating maximum,
wherein the second phosphor has a second absorption maximum, which differs from the first absorption maximum, and a second radiating maximum, which differs from the first radiating maximum,
wherein the degree of conversion of the first phosphor for the electromagnetic radiation of the first light-emitting diode chip is greater than the degree of conversion of the second phosphor for the electromagnetic radiation of the first light-emitting diode chip,
wherein the semiconductor light source further comprises a third light-emitting diode chip, which emits electromagnetic radiation with a third emission maximum, which differs from the first emission maximum and from the second emission maximum, during operation,
wherein:
the first emission maximum lies approximately at 440 nm,
the second emission maximum lies approximately at 450 nm,
the third emission maximum lies in between at least 600 nm and at most 660 nm,
the first absorption maximum lies approximately at 440 nm,
the second absorption maximum lies approximately at 450 nm,
the first radiating maximum lies approximately at 520 nm, and
the second radiating maximum lies approximately at 565 nm, and
wherein the value indications include tolerances of ±5%.

* * * * *